United States Patent [19]

Mathuni et al.

[11] 4,390,394
[45] Jun. 28, 1983

[54] METHOD OF STRUCTURING WITH METAL OXIDE MASKS BY REACTIVE ION-BEAM ETCHING

[75] Inventors: Josef Mathuni; Karin Unger, both of Munich, Fed. Rep. of Germany

[73] Assignee: Siemens Aktiengesellschaft, Berlin & Munich, Fed. Rep. of Germany

[21] Appl. No.: 338,605

[22] Filed: Jan. 11, 1982

[30] Foreign Application Priority Data

Jan. 27, 1981 [DE] Fed. Rep. of Germany ....... 3102647

[51] Int. Cl.³ .......................... C23F 1/02; B44C 1/22; C03C 15/00; C03C 25/06
[52] U.S. Cl. .................................. 156/643; 156/646; 156/652; 156/659.1; 156/667; 156/904; 204/192 E
[58] Field of Search ............... 156/643, 646, 650–653, 156/656, 659.1, 667, 904; 204/164, 192 EC, 192 E, 298; 427/38, 39, 45.1; 252/79.1

[56] References Cited

U.S. PATENT DOCUMENTS 3,904,462  9/1975  Dimigen et al. ................ 204/192 E
3,975,252  8/1976  Fraser ........................... 204/192 E
4,132,586  1/1979  Schaible et al. ................ 204/192 E

FOREIGN PATENT DOCUMENTS 52-9647  1/1977  Japan ................................. 156/643
56-3680  1/1981  Japan ................................. 156/643

OTHER PUBLICATIONS

Michel Contagrel, "Considerations on High Resolution Patterns Engraved by Ion Etching", *IEEE Transactions on Electron Devices*, vol. ED-22, Jul. 1975, pp. 483–486.

Primary Examiner—William A. Powell
Attorney, Agent, or Firm—Hill, Van Santen, Steadman, Chiara & Simpson

[57] ABSTRACT

Very fine circuit structures in microelectronics are produced by first applying a thin metal oxide layer uniformly over an entire surface of a layer to be etched, then applying a resist layer uniformly over the entire metal oxide layer and structuring such oxide layer by ion-beam etching and, utilizing the structured oxide layer as a mask, performing a dry-etching with an ion beam of the metal layer lying thereunder so as to attain structures having very unfavorable resist height to etching depth ratios.

5 Claims, 4 Drawing Figures

METHOD OF STRUCTURING WITH METAL OXIDE MASKS BY REACTIVE ION-BEAM ETCHING

BACKGROUND OF THE INVENTION

1. Field of the Invention

The invention relates to methods of producing circuit structures and somewhat more particularly to method of producing very fine circuit structures in microelectronics with very thin thin masks comprised of photosensitive resists or electron-or x-ray-sensitive resists.

2. Prior Art

Generally, in the production of fine and extremely fine structures in microelectronics, photo sensitive resists or resists which are electron or x-ray sensitive are utilized as masking. With increasing integration, the resist thickness, must also be reduced. Simultaneously, wet etching techniques are being more and more frequently replaced by dry etching techniques, such as plasma, sputtering or ion-beam etching. The last two dry-etching techniques operate with a directed ion beam which can bring about significant resist erosion, depending upon the energy level and ion type (argon, reactive gases, etc.) utilized. In addition, the erosion rate of a resist is strongly depended upon the angle of the incident ions and exhibits the largest erosion rate at approximately 60° angles of incidents (deviations from the normals). This effect causes sloping resist flanks (60°), which become more and more sloping with increased etching periods. The result of this is slanting edges on the etched layer and a lateral shrinkage of desired structure dimensions. The above problem is particularly noticeable when the material to be etched has no selectivity relative to the resist utilized (especially in instances of etching metals with argon) or when the layer to be etched is relatively thick.

A known solution to this problem is, as described for example by M. Cantagrel in *IEEE Transactions on Electron Devices*, Vol. ED-22 No. 7 (July 1975) pages 43–46, is to first apply a thin metal film (for example composed of Ti, V, Mn or Al) over the layer to be etched and structuring such film with a resist. This structured metal film then can function as a masking for the underlying layer. In this process, advantage is taken of the fact that for many metals, the etching rate of the metal oxide with Ar-ions is significantly less than that of the metal itself. In this manner, one can first, in a wet-chemical manner, by means of a plasma, or a reactive sputter-etching (i.e., RIE) by ion-beam or sputter etching with pure argon or by a "lift off" technique structure the corresponding metal film and then utilize it as a mask whereby further etching occurs with a mixture of Ar and about 10% $O_2$. A metal oxide is then formed during this etching on the surface of the metal mask.

However, the foregoing method has several disadvantages. For example, the metal layer which functions as masking is very difficult to structure. Often one finds a thin oxide layer present, which makes the wet chemical or plasma etching (structuring) of the metal more difficult. Further, such oxide layer causes varying etching action which leads to undefined under-etching. On the other hand, in sputtering or ion-beam of such metal masks, the etchant selectivity relative to the resist utilized (particularly PMMA, ie., polymethylmethacrylate) is generally too low to prevent a resist shrinkage and thus a lateral shrinkage of the mask. A further disadvantage is that in the subsequent etching of the layer with an Ar-$O_2$ mixture, only such materials can be etched which themselves do not form oxides which are resistant to Ar bombardment, for example gold.

SUMMARY OF THE INVENTION

The invention provides a method of producing very fine structures in microelectronics which avoid the prior art disadvantages and allows good resolution of the desired structures by structuring with metal oxide masks with reactive beam etching.

In accordance with the principles of the invention, a thin metal oxide layer is first applied over a layer to be etched and such oxide layer is structured with conventional resists through ion-beam etching and thereafter, the resultant structured metal oxide layer is utilized as a mask for the layer thereunder during a dry-etching ion-beam process. In this manner, the use of ion-beam etching is feasible even in instances of very unfavorable ratios of resist height to etching depth.

In an embodiment of the invention, a fluorocarbon, for example, trifluoromethane, is utilized as an etching gas for etching the metal oxide layer selectivity relative to photosensitive resists or resist which are sensitive to x-rays or electron beams. With the use of, for example, trifluoromethane as an etching gas, various metal oxides (ie, $TiO$, $Al_2O_3$, $Ta_2O_5$, $MgO$, $MnO$, $VO$) can be etched with comparatively high selectivity (factors of 3–10) relative to photosensitive resists or x-ray or electron-beam-sensitive resits (ie, PMMA). In this manner, even with small resist heights, very fine structures can be produced on metal oxide masks without lateral shrinkage. The remaining resist can function as an additional protective layer, at least at the beginning and during the subsequent actual etching.

In a further embodiment of the invention during the same work step, the actual etching of the layer to be structured can be carried out with a suitable gas, for example, pure argon. This presumes that a mask is already present as an oxide layer. An advantage of this embodiment is that the overall system or working arrangement (ionization filaments, grid system, etc.) is spared. Another advantage is that all kinds of materials can be etched and especially those which form oxides resistant to argon bombardment or etching. The remaining metal oxide mask can be removed with a suitable etchant at the conclusion, if necessary.

DESCRIPTION OF THE PREFERRED EMBODIMENTS

Figure 1:
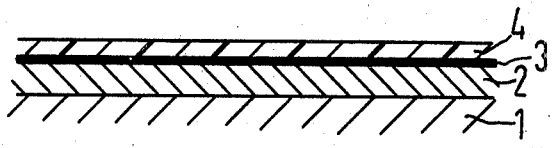
FIGS. 1–4 are elevated, partial schematic and sequential views of a substrate having fine structures produced thereon in accordance to the principles of the invention.

In the drawings, like reference numerals designate like parts.

As shown at FIG. 1 in each instance, a substrate 1 is provided, which can, for example, be composed of a silicon dioxide layer formed on a non-illustrated semiconductor disc, during the fabrication of a desired circuit. Normally, such a semiconductor disc contains at least one integrated circuit produced in a customary manner and which includes ohmic contacts (not shown). A layer 2, which is normally structured by dry-etching techniques, is positioned on substrate 1. Next, a metal oxide layer 3 is vapor deposited or atomized onto layer 2. Thereafter, a layer 4 composed of a removable masking material is applied onto layer 3. The masking material forming layer 4 is characterized as an organic polymer material, which, for example, can be a photosensitive resist, an electron-beam-sensitive resist or x-ray sensitive resist, and which can be applied as a coating in a customary manner, for example by centrifical action (FIG. 1).

Figure 2:
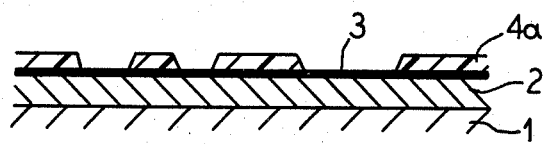
Figure 3:
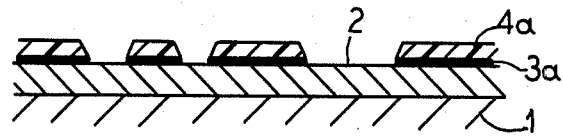
Figure 4:
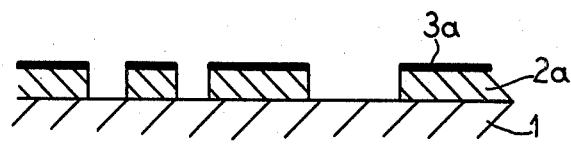

During a first work step, the resist layer 4 is structured in a customary manner to produce a resist mask 4a (FIG. 2). Next, by reactive ion-beam etching the metal oxide layer 3 is structured so as to be etched away at those areas thereof which are not covered by resist mask 4a, without resist shrinkage and accurate in size to produce an oxide mask 3a (FIG. 3). Finally, in the same set-up, during a subsequent work step, the layer 2, which is to be structured, is etched away at areas thereof not covered with oxide mask 3a, for example with an argon ion beam.

As is apparent from the foregoing specification, the present invention is susceptable of being embodied with various alterations and modifications which may differ particularly from those that have been described in the preceding specification and description. For this reason, it should be fully understood that all the foregoing is intended to be merely illustrative it is not to be construed or interpreted as being restrictive or otherwise limiting of the present invention, excepting as it is set forth and defined in the hereto-apended claims.

We claim as our invention:

1. In a method of producing very fine structures in microelectronics with very thin photosensitive resists or resists which are electron- or x-ray-sensitive as masking, the improvement comprising:

first applying a thin metal oxide layer over a layer to be etched and structuring such oxide layer with a resist by reactive ion-beam etching so as to attain a metal oxide mask; and dry-etching with an ion-beam the layer to be etched through said metal oxide mask.

2. In a method as defined in claim 1 wherein a fluorocarbon is utilized as an etching gas for structuring said metal oxide layer selectively relative to a resist selected for the group consisting of a photosensitive resist, an electron-sensitive resist and a x-ray-sensitive resist.

3. A method as defined in claim 2 wherein said fluorocarbon is trifluoromethane.

4. In a method as defined in claim 1 wherein during the work step of structuring said metal oxide layer, the dry etching of the layer to be etched occurs with a suitable etching gas.

5. In a method as defined in claim 4 wherein said suitable etching gas is argon.

* * * * *